(12) United States Patent
Boerner

(10) Patent No.: US 8,334,651 B2
(45) Date of Patent: Dec. 18, 2012

(54) ELECTROLUMINESCENT DEVICE WITH ELECTRICAL SHUNT

(75) Inventor: Herbert Friedrich Boerner, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 13/146,945

(22) PCT Filed: Jan. 27, 2010

(86) PCT No.: PCT/IB2010/050364
§ 371 (c)(1), (2), (4) Date: Oct. 11, 2011

(87) PCT Pub. No.: WO2010/089680
PCT Pub. Date: Aug. 12, 2010

(65) Prior Publication Data
US 2012/0019129 A1 Jan. 26, 2012

(30) Foreign Application Priority Data

Feb. 5, 2009 (EP) ..................................... 09152169
Feb. 5, 2009 (EP) ..................................... 09152170
Apr. 29, 2009 (EP) ..................................... 09159047

(51) Int. Cl.
*H05B 33/14* (2006.01)
(52) U.S. Cl. ........ 313/504; 313/506; 313/507; 313/508; 257/40; 257/269; 315/169.1
(58) Field of Classification Search .......... 313/498–512; 315/169.1, 169.3; 257/40, 269
See application file for complete search history.

(56) References Cited

FOREIGN PATENT DOCUMENTS

| EP | 16934883 A2 | 8/2006 |
|---|---|---|
| JP | 2001015268 A1 | 1/2001 |
| WO | 2005051049 A1 | 6/2005 |
| WO | 2005053053 A1 | 6/2005 |
| WO | 2005106573 A1 | 11/2005 |
| WO | 2006030338 A1 | 3/2006 |
| WO | 2008090493 A1 | 7/2008 |
| WO | 2008126267 A1 | 10/2008 |
| WO | 2008132655 A2 | 11/2008 |
| WO | 2008135902 A2 | 11/2008 |
| WO | 2009001241 A1 | 12/2008 |

OTHER PUBLICATIONS

Hitoshi ,Japanese Patent Application Publication 2001-015268 ,Jan. 2001, machine translation.*

* cited by examiner

*Primary Examiner* — Tracie Y Green
(74) *Attorney, Agent, or Firm* — Mark L. Beloborodov

(57) ABSTRACT

The invention relates to an electroluminescent device (10) comprising a substrate (40) and on top of the substrate (40) a substrate electrode (20), a counter electrode (30) and an electroluminescent layer stack with at least one organic electroluminescent layer (50) arranged between the substrate electrode (20) and the counter electrode (30), and at least one electrical shunt means (122) applied on top of the substrate electrode (20) to improve the current distribution over the substrate electrode (20), wherein the at least one electrical shunt means (122) is at least one element of the group of a wire, a metallic stripe or foil, said electrical shunt means (122) fixed to the substrate electrode (20) by a protective means (70) fully covering the electrical shunt means (122) with a shape suitable to prevent the emergence of a shadowing edge on the substrate electrode (20). The invention further relates to a method to manufacture such a device.

14 Claims, 10 Drawing Sheets

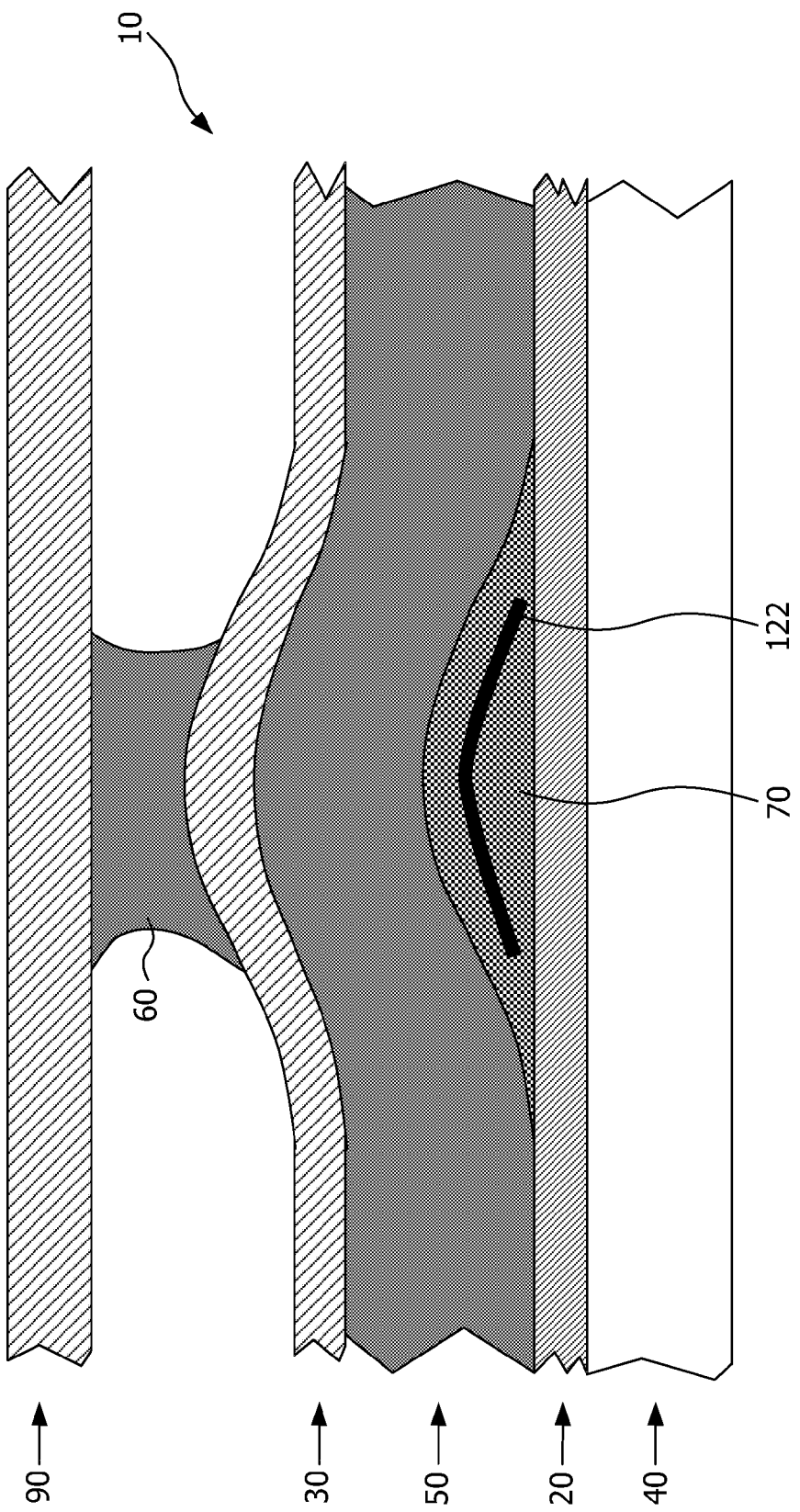

ELECTROLUMINESCENT DEVICE WITH ELECTRICAL SHUNT

FIELD OF THE INVENTION

The present invention relates to an electroluminescent device comprising a substrate and on top of the substrate a substrate electrode, a counter electrode and an electroluminescent layer stack with at least one organic electroluminescent layer arranged between the substrate electrode and the counter electrode, whereas at least one electrical shunt means is applied on the top of the substrate electrode to improve the current distribution over the substrate electrode. Moreover, the present invention is directed to a method for shunting a substrate electrode of an electroluminescent device by an electrical shunt means.

BACKGROUND OF THE INVENTION

In the WO 2009/001241 A1 an organic light emitting diode (OLED) is described. The electroluminescent device comprises a substrate having a substrate electrode and a plurality of mutually spaced apart electrical shunt means, each being in direct electrical contact with the substrate electrode. Moreover, an electroluminescent layer stack is provided on top of the substrate electrode, and a counter electrode is arranged on top of the electroluminescent layer stack. A lid is attached to the substrate to hermetically enclose the electroluminescent layer stack between the lid and the substrate, thus, the lid forms an encapsulation means. The electroluminescent device further comprises a plurality of insulation spacer structures, each being arranged between the lid and the substrate in a position corresponding to the electrical shunt means.

The electrical shunt means are conductive structures which are provided in direct electrical contact with said substrate electrode in order to make the current distribution across the area of the electroluminescent device more homogenous during operation. These electrical shunt means are disclosed as metallic stripes, which may form a grid. In order to apply said electrical shunt means on the substrate electrode, different manufacturing processes are disclosed, generally basing on a material deposition technique. For example, screen printing or photolithography using a sufficiently thick (>30 µm) resist layer may be utilized. Alternatively, hot-melt inkjet printing, also sometimes referred to as "solid inkjet printing", can be applied. When using hot-melt inkjet printing, printed patterns should be well defined and structures should have a suitable height, such as between 30 and 70 µm, and smooth, shallow edges having a contact angle to the surface, on which the spacer structures are printed of about 60° or less.

Unfortunately, the application of material deposition techniques or material printing techniques for manufacturing said electrical shunt means on the surface of the substrate electrode leads to different problems. The application of said manufacturing techniques is basically laborious and expensive.

SUMMARY OF THE INVENTION

Thus, the invention has for its object to eliminate the above-mentioned disadvantages. In particular, it is an object of the invention to disclose an improved application of electrical shunt means on the surface of the substrate electrode.

This object is achieved by an electroluminescent device as taught by claim 1 of the present invention. Also the object is achieved by a method as taught by claim 14 of the present invention. Advantageous embodiments of the electroluminescent device and the method are defined in the sub claims. Features and details described with respect to the electroluminescent device also apply to the method and vice versa.

The invention discloses an electrical shunt means, selected as at least one element of the group of a wire, a metallic stripe or a foil, whereas said electrical shunt means are fixed to the substrate electrode by a protective means fully covering the electric shunt means with a shape suitable to prevent the emergence of a shadowing edge on the substrate electrode.

The leading idea of the present invention is to use a wire, a metallic stripe or foil as a single conductive element, which subsequently is applied on the surface of the substrate electrode and forming an electrical shunt means. The wire can feature a diameter of a few microns up to several hundred microns, whereas in the scope of the present invention the diameter of the wire is not limited. The application of electrical shunt means on the surface of the substrate electrode leads to an improved current distribution over the lateral extension of the substrate electrode. While depositing a substrate electrode material on the substrate material as the carrier, it is an objective to apply a low thickness of the substrate electrode, in order to increase the amount of emitted light, generated by the organic electroluminescent layer. Unfortunately, the electrical resistance within the substrate electrode increases with decreasing the thickness, and therefore the voltage drop from the edge to the middle of the substrate electrode gets larger during operation and as a consequence the current distribution and the luminance are inhomogeneous.

In order to overcome this disadvantage, electrical shunt means are applied forming an electrical connection with small resistivity primarily between an outer or border area of the substrate electrode to an inner area of the substrate electrode enabling a more homogeneous current distribution over the area of the substrate electrode. Each of the electrical contact points, which are interconnected via said electrical shunt means across the substrate electrode, is on almost the same electrical potential even under operation. Thus, the brightness of the emitted light across the entire area is more homogenous. In the general idea of the present invention single electrical conductive elements can be applied on the substrate electrode forming the electrical shunt means. These single electrical conductive elements can be performed as simple elements like a wire, a cable, a metallic stripe or a foil, which are laid on the surface of the substrate electrode and which are electrically contacted to the substrate electrode, respectively. These single conductive elements are basically not manufactured via a deposition technique, and the manufacturing of the electrical shunt means are not based on screen printing or a photolithography technique. Moreover, the manufacturing of the shunt means is not based on hot-melt inkjet printing, which is also referred to as a solid inkjet printing.

In order to overcome the disadvantage of the emergence of shadowing edges on the substrate electrode, leading to problems in layering the electroluminescent layer stack and the counter electrode, respectively, the single conductive elements forming the electrical shunt means are fixed to the substrate electrode by a protective means fully covering the electrical shunt means. This protective means features a shape, suitable to prevent the emergence of a shadowing edge on the substrate electrode. Moreover, the protective means is fully covering the electrical shunt means with a shape, featuring a smooth transitions between the shunt means, formed by said conductive element, and the remaining surface of the substrate electrode.

In the context of the invention the notion electroluminescent (EL) layer stack denotes all layers prepared between the substrate and counter electrodes. In one embodiment of an electroluminescent layer stack, it comprises at last one light emitting organic electroluminescent layer prepared between the substrate and the counter electrode. In other embodiments the layer stacks may comprise several layers prepared between the substrate and the counter electrode. The several layers may be organic layers, such as one or more hole transport layers, electron blocking layers, electron transport layers, hole blocking layers, emitter layers or a combination of organic and non-organic layers. The non-organic layers may be additional electrodes in case of two or more light emitting layers within the layer stack and/or charge injection layers. In a preferred embodiment the substrate electrode and/or the counter electrode comprise at least one of the following materials: ITO, aluminum, silver, doped ZnO, an oxide layer.

In the context of the invention the notion substrate material denotes a base material onto which the different layers of the electroluminescent device are deposited. Normally, the substrate is transparent and is made of glass. Furthermore, it may be preferable that the substrate is transparent, preferably comprising at least one of the following materials: silver, gold, glasses or ceramics. It may also be made of a transparent polymer sheets or foils with a suitable moisture and oxygen barrier to essentially prevent moisture and/or oxygen entering the electroluminescent device layer stack. It is also possible to use non-transparent materials like metal foils as the substrate. The substrate may comprise further layers, e.g. for optical purposes like light out-coupling enhancement or other purposes. The substrate is usually flat, but it may also be shaped into any three-dimensional shape that is desired.

In the context of the invention the notion substrate electrode denotes an electrode deposited on top of the substrate. Usually it consists of transparent ITO (Indium-Tin Oxide) optionally with an undercoating of $SiO_2$ or SiO to suppress diffusion of mobile atoms or ions from the glass into the electrode. For a glass substrate with an ITO electrode, the ITO is usually the anode, but in special cases it can also be used as the cathode. In some cases, thin Ag or Au layers (8-15 nm thick) are used single or in combination with ITO as the substrate electrode. If a metal foil is used as the substrate, it takes also the role of the substrate electrode, either anode or cathode. The notation on-top-of denoted the sequence of the listed layers. This notation explicitly comprises the possibility of further layers in between the layers denoted as on top of each other. For example, there might be additional optical layers to enhance the light out-coupling arranged between the substrate electrode and the substrate.

In the context of the invention the notion counter electrode denotes an electrode away from the substrate. It is usually non-transparent and made of Al or Ag layers of sufficient thickness such that the electrode is reflecting (typically 100 nm for Al and 100-200 nm for Ag). It is usually the cathode, but it can also be biased as the anode. For top-emitting or transparent electroluminescent devices the counter electrode has to be transparent. Transparent counter electrodes are made of thin Ag or Al layers (5-15 nm) or of ITO layers deposited on top of the other previously deposited layers.

In the context of the invention an electroluminescent device with a combination of a transparent substrate, a transparent substrate electrode and a non-transparent counter electrode (usually reflective), emitting the light through the substrate is called "bottom-emitting". In case of an electroluminescent device comprising further electrodes, in certain embodiments both substrate and counter electrodes could be either both anodes or both cathodes, when the inner electrodes are driven as cathodes or anodes. Furthermore, in the context of the invention an electroluminescent device with a combination of a non-transparent substrate electrode and a transparent counter electrode, emitting the light through the counter electrode is called "top-emitting".

In the context of the invention the notion transparent electroluminescent device denotes an electroluminescent device, where the substrate, the substrate electrode, the counter electrode and the encapsulation means are transparent. Here the electroluminescent device is both, bottom and top-emitting. In the context of the invention a layer, a substrate or an electrode is called transparent if the transmission of light in the visible range is more than 50%; the rest being absorbed or reflected. Furthermore, in the context of the invention a layer, a substrate or an electrode is called semi-transparent if the transmission of light in the visible range is between 10% and 50%; the rest being absorbed or reflected. In addition, in the context of the invention light is called visible light, when it possesses a wavelength between 450 nm and 650 nm. In the context of the invention light is called artificial light, when it is emitted by the organic electroluminescent layer of the electroluminescent device.

Furthermore, in the context of the invention a layer, connector or construction element of an electroluminescent device is called electrical conducting if its electrical resistance is less than 100000 Ohm. In the context of the invention passive electronic components comprise resistors, capacitors and inductivities. Furthermore, in the context of the invention active electronic components comprise diodes, transistors and all types of integrated circuits.

In the context of the invention a layer, a substrate, an electrode or a construction element of an electroluminescent device is called reflective if light incident on its interface is returned according to the law of reflection: the macroscopic angle of incidence equals the macroscopic angle of reflection. Also the term specular reflection is used in this case. Furthermore, in the context of the invention a layer, a substrate, an electrode or a construction element of an electroluminescent device is called scattering if light incident on it is not returned according to the law of reflection: macroscopic angle of incidence is not equal to the macroscopic angle of the returned light. There is also a distribution of angles for the returned light. Instead of scattering, the term diffuse reflection is also used.

In its preferred embodiment, said protective means is performed as an electrical conductive protective means, whereas said protective means preferably comprises electrical conductive glue. The electrical shunt means can be embedded within the protective means, and the electrical contacting between the shunt means and the substrate electrode is formed via the electrical conductive glue along the entire length of the shunt means, formed by the conductive element. When the shunt means is applied on the substrate electrode, and the electrical conductive glue embeds the shunt means, the electrical conductive glue forms a flat cover means along the shunt means amongst others due to capillary effects. The use of electrical conductive glue as a protective means leads to a simple application of the shunt means, formed by single conductive elements, and the mechanical arrangement of the shunt means comprising the electrical contacting of the shunt means to the substrate electrode both is achieved by the application of said electrical conductive glue.

In a preferred embodiment the conductive glue comprises a matrix and filler. Preferably, the conductive glue comprises organic materials as the matrix and inorganic materials as the filler. In one embodiment, the conductive glue may comprise at least one of the following matrices: epoxies, polyurethanes or silicones. The filler and/or the matrix have to be conductive to conduct the electrical current from the electrical source to the counter electrode.

Therefore, it is preferred, that the conductive glue and/or the filler comprise conductive flakes or particles. The filler particles must possess low resistance, stability and durability. Therefore, it is preferred that the filler comprises flakes or particles of: Silver, Gold, Nickel, Platinum, Copper, Palladium and/or other metals or other nonmetals like Carbon, glassy Carbon, Graphite, Carbon nanotubes, doped ZnO, SnO, electrical conductive nitrides, electrical conductive borides, metal covered glass or plastic beads, metal covered glass or plastic hollow beads or metal or graphite particles covered with copper, gold or silver.

In a preferred embodiment the conductive glue is anhydrous and/or water free. In the context of the invention, the notion water free and/or anhydrous describes the fact, that no degradation due to water content during the average lifetime of an electroluminescent device can be observed by the naked eye. A visible degradation of the organic electroluminescent layer due to water diffusing into the layer stack can take the form of growing black spots or shrinkage of the emissive region from the edges. The notion water free and/or anhydrous not only depends on the conductive glue itself but also on the amount of water, which can be absorbed by the organic electroluminescent layer without damaging it.

In a further preferred embodiment the electroluminescent device may comprise moisture and/or oxygen barriers. In the context of the invention layers prevention harmful diffusion of moisture and/or oxygen into the layer stack are called moisture and/or oxygen barriers. A diffusion is denoted as harmful if a significant life-time reduction of the emitted light can be observed. Standard OLED devices according to the state of the art achieve shelf life times in the order of 100000 hours or more. A significant reduction denotes a reduced life-time of about a factor of 2 or more.

According to another embodiment of the present invention, every electrical shunt means is fixed to the substrate electrode by at least two electrical connecting means, whereas said electrical connecting means preferably are arranged fully covered by the protective means and whereas said protective means according to the embodiment is preferably performed as an electrical non-conductive protective means. The electrical connecting means forms single contact points, which can form end posts of the single conductive elements or the electrical connecting means forms a plurality of electrical contact posts along the lengthwise extension of the electrical shunt means. When the protective means is performed as an electrical non-conductive protective means, the risk of a short between the electrical shunt means and the counter electrode is avoided. Moreover, the electrical connection between the shunt means and the substrate electrode is limited to the electrical connecting means, forming the contact post. The electrical non-conductive protective means may comprise electrical non-conductive glue, and forms an alternative to electrical conductive glue forming an electrical conductive protective means, and said electrical connecting means are necessary for contacting the shunt means to the substrate electrode, only when the protective means is non-conductive.

According to another preferred embodiment of the present invention, the electrical connecting means is at least one element of the group of electrical conductive glue, electrical conductive resin and/or electrical conductive lacquer. The named agents can easily be applied onto said electrical shunt means forming the contact posts in the form of liquid drops, whereas after applying said agents a subsequent curing begins. Depending on the behaviour of the agent of the electrical connecting means said protective means made of electrical non-conductive glue can be applied directly after the application of the connecting means, and the curing of both, the connecting means and said protective means may happen simultaneously.

As another embodiment, the electrical connecting means applied to the electrical shunt means may form a symmetrical array of electrical connecting means, whereas the array preferably is performed as a hexagonal array. The array may form a kind of a matrix, and the arrangement of the electrical connecting means may be extended across the entire emitting field of the electroluminescent device. Between the electrical connecting means said shunt means form electrical connecting lines. Said electrical connecting means can be arranged in horizontal lines and vertical columns, but in its advantage, the electrical shunt means form an array in a hexagonal manner. This leads to the advantage that the visibility for human eyes is decreased, when the array is performed as a hexagonal array. Unfortunately, said electrical connecting means may lead to dark regions within the emitting field of the electroluminescent device, and thus, when arranging the electrical connecting means in a hexagonal array, the visibility of said dark regions is decreased.

According to yet another embodiment at least one electrical contact means is arranged for electrically contacting the counter electrode to an electrical power source, whereas the electrical non-conductive protective means is arranged at least fully covering the area below the contact means, and whereas said electrical contact means preferably features electrical conductive glue. This leads to the advantage that a three-dimensional contact schema with a minimum risk of shorts is provided.

A further advantage achieved by the usage of conductive glue as a contact means is, that a substrate with only one contiguous electrode can be used, which serves as a substrate electrode for the electroluminescent device. In known OLEDs, the electrode on the substrate is at least structured into two electrical separate regions: one serving as the substrate electrode and the other one connected to the counter electrode. Thus both the substrate and the counter electrode are led in one plane to the rim of the substrate, where they can be contacted by standard means. The disadvantage of this 2-dimensional contacting scheme is that the substrate electrode as well as the counter electrode have to share the periphery of the OLED for contacting, so that the electrode on the substrate needs to be divided into at least two disjoint regions (substrate electrode and second electrode to be contacted with the counter electrode) to avoid shorting the device. The disclosed 3-dimensional contacting eliminates this serious disadvantage of the 2-dimensional contacting.

The arrangement of the electrical non-conductive protective means at least fully covering the area below the contact means leads to the advantage that shorts between the substrate electrode and the counter electrode are avoided during setting the glue on the counter electrode. If no restriction on the type of glue is desired, and if the counter electrode cannot be made thicker, said non-conductive protective means is applied to the substrate electrode to prevent a possible short due to the conductive glue. The use of at least one protective means makes the electroluminescent device completely insensitive to the specific properties of the conductive glue. Therefore, all known conductive glues can be used for contacting the counter electrode to an electrical source. The protective means has to cover the full area where the contact means is applied to the counter electrode, since this might be the source of shorts, but it could also be larger than the area of the contact means. To prevent a direct contact between the counter electrode and the substrate electrode, it is preferable that the protective means has a thickness and/or a hardness, which assures that the contact means can not get into electrical contact with the substrate electrode. To achieve this object, the protective means may comprise non-conductive glue and/or a photoresist and/or a lacquer and/or a paint and/or a layer of glass, made of re-melted glass frit. The protective means may also comprise an oxidized metal layer like anodised aluminium. People skilled in the art may choose other electrical non-conductive materials within the scope of the present invention.

The protective means must have properties that on the one hand ensure that it is electrical non-conductive. Furthermore, it must be thick and/or hard enough to shield the substrate electrode from the contact means. The precise thickness and hardness depend on the actual pressure exerted by the contact means, but typically 1-100 micron thickness are sufficient. The desired protection has been achieved with photoresist layers of 1.5 micron thickness as well as with layers of non-conductive glue of 10-200 micron thickness, but thicker layers can also be used. Furthermore, it must be ensured that the protective means does not damage either the substrate electrode, the organic electroluminescent layer nor the counter electrode. In its preferred embodiment the protective means comprises non-conductive glue. Furthermore, it is preferable that the non-conductive glue of the protective means is anhydrous and/or water free. Furthermore, it is preferable that the non-conductive glue of the protective means is anhydrous and/or water free.

Advantageously, the electroluminescent device features an encapsulation means, which is arranged for encapsulating at least said electroluminescent layer stack, whereas the electrical contact means is preferably arranged in between said encapsulation means and the counter electrode for electrically contacting the counter electrode to the encapsulation means. When the top of encapsulation means is conductive, the electrical contact means is current supplied by the top of encapsulation means. In this case, the side of encapsulation means can be isolating, in order to ensure the electrical isolation between the substrate electrode and the counter electrode. When the side of the encapsulation means is electrically conductive and contacted to the substrate electrode, the electrical contact means can be contacted to an electrically isolated feed through in the top of a conductive encapsulation means. In case of a non-conductive top of the encapsulation means, a simple conductive feed through may alternatively be applied.

The encapsulation means may also encapsulate the whole stack of layers of the electroluminescent device or just a plurality of layers, forming a part of the whole stack of layers. Preferably, the encapsulation means is provided as a gas-tight element, covering at least the organic electroluminescent layer and the counter electrode. By using a gas-tight encapsulation means, it is prevented that environmental factors like water or oxygen damage the encapsulated layers. The encapsulation means may form a gas-tight lid. This lid may be formed of glass or metal. It is also possible to form the encapsulation means by one or a plurality of layers supplied to the electroluminescent device or just parts of it. The layers may comprise silicone, silicone oxide, silicone nitride, aluminium oxide or silicone oxynitride. All the named encapsulation means prevent mechanical and/or environmental factors from affecting the layer stack of the electroluminescent device adversely. As an example, the encapsulation means can be made of metals, glasses, ceramics or combinations of these. It is attached to the substrate by conductive or non-conductive glue, melted glass frit or metal solder. Therefore, it may also provide mechanical stability for the electroluminescent device, whereas at least parts of the applied glue between the layers and the encapsulation means is electrical conducting for contacting the counter electrode.

Preferably, the electrical shunt means comprises a metallic wire, a metallic stripe or a metallic foil preferably made of copper, gold and/or silver alloy, whereas said metallic stripe or said metallic foil is preferably made by die-cutting. The alloys forming the electrical shunt means can be selected from alloys used for electrical conductors as known to a person skilled in the art. When said conducting elements are manufactured by die-cutting, a cheap mass-production technique can be applied forming the shunt means, in particular when the shunt means are arranged in a grid-form, and the entire grid can be finished by only a few die strokes or in particular only one die stroke.

According to another advantageous embodiment, the protective means comprises at least one scattering means for scattering light, generated by the organic electroluminescent layer, whereas the scattering means preferably is embedded, dissolved and/or contained within the protective means and/or the electrical connecting means. As disclosed the protective means may comprise non-conductive glue. This non-conductive glue may be transparent, opaque or comprise scattering properties. Depending on the material used for the protection means, experiments have shown that the area to which the protection means is applied may appear dark at normal operation of the electroluminescent device, since charge injection from the counter electrode or the substrate electrode to the electroluminescent layer stack is blocked. Therefore, another preferred embodiment is characterized in that the protective means comprises at least one scattering means, for scattering light generated by the organic electroluminescent layer; preferably that the scattering means is embedded in the protective means. This scattering means scatters and or reflects part of the artificial light guided by the substrate. This results in a brightening of the otherwise non-emissive area. As the substrate often works as a kind of light guide, the scattering means of the protective means enables this light to be scattered and reflected out of the electroluminescent device. The scattering means may be formed by a plurality of pigments and/or flakes embedded in the protective means. This pigments and/or flakes may for example comprise: aluminum, mica effect pigments, titan dioxide particles or other flakes or particles known to a person skilled in the art as scattering and/or reflecting the artificial light of the organic electroluminescent device.

To achieve a homogeneous distribution of the voltage across the area of the counter electrode under operation of the electroluminescent device it is preferred, that a plurality of contact means are applied to the counter electrode. By using a number of contact means, the achieved distribution of the voltage is more homogeneous. As the contact means is formed by conductive glue it is easy to apply a plurality of contact means—for example drops of conductive glue—to the counter electrode. These drops of conductive glue may be in direct contact with the encapsulation means. Therefore, to connect the electroluminescent device to an electrical source it is just needed to connect the encapsulation means to the electrical source. The encapsulation means will most probably have a resistance, which is orders of magnitude smaller than those of the counter electrode. Therefore, all contact means will be connected to the same potential. This leads to a uniform distribution of voltage and current to the organic electroluminescent layer and in a homogeneous generation of artificial light by the organic electroluminescent layer. The number of contact means applied to the counter electrode depends on the one hand on the resistance of the counter electrode and on the other hand on the size of the counter electrode. For known electroluminescent devices it has shown to be preferable that the following numbers of contact means are applied to the counter electrode: 2, 4, 5, 8, 16 or 32.

In another preferred embodiment the counter electrode is structured into a plurality of electrically disconnected counter electrode segments, wherein each counter electrode segment comprises at least one contact means. As described above, there exists a plurality of embodiments how to connect the contact means of each counter electrode segment to the electrical source.

In another preferred embodiment the protective means is dyed. This may be done by colouring the protective means itself or by applying coloured pigments to the protective means.

According to yet another embodiment of the present invention, the protective means features a specific spatial geometry, leading to an improved outcoupling of light, generated by the organic electroluminescent layer. Said specific spatial geometry can be formed within the protective means made of conductive and preferably non-conductive glue, e.g. via a special glue application tool leading to a predetermined shape of the glue forming the protecting means and encapsulating the shunt means.

According to a preferred specific spatial geometry formed by the protective means, the protective means comprises an optical outcoupling body forming said specific spatial geometry and leading to an improved outcoupling of light, generated by the organic electroluminescent layer, whereas said optical outcoupling body is preferably made of an optical transparent material featuring an index of refraction, which is nearly equal to or higher than the index of refraction of the substrate. Said optical outcoupling body can be embedded completely by the protective means, formed by glue. By aligning the optical refraction index of the optical outcoupling body to the index of refraction of the substrate material, the outcoupling effect of the light, generated by the organic electroluminescent layer, can be maximized due to the optimised optical transition between said optical outcoupling body and said substrate material.

According to yet another embodiment, the electrical shunt means can be arranged on the surface of the substrate electrode, whereas said optical outcoupling body covers the electrical shunt means in a way, that the arrangement of the electrical shunt means is performed sandwich-like in between said substrate electrode and said optical outcoupling body. Thus, the optical outcoupling body can be glued to the substrate electrode by an optical transparent glue, featuring a high index of refraction, which preferably matches the index of refraction of the substrate. The glue between the optical outcoupling body and the substrate can differ from the glue of the protective means, embedding said optical outcoupling body. The cross-section of said optical outcoupling body may be formed rectangular, triangular, prismatic, parabolic, semi-circular or elliptic and whereas the optical outcoupling body preferably is manufactured by an injection moulding process.

Moreover, said optical outcoupling body may feature a grid structure, which is preferably performed as a rectangular grid, a hexagonal grid or an irregular grid, applied on the substrate electrode. The grid structure of the optical outcoupling body can be aligned to the grid structure of the electrical shunt means, and the sandwich-like arrangement of the shunt means between the optical outcoupling body and the substrate electrode is realized across the entire emitting field of the electroluminescent device. If different electrical connecting means form a number of contacting posts for electrically contacting the electrical shunt means to the substrate electrode, the optical outcoupling body may feature cavities in order to receive for the electrical connecting means, and preferably the electrical connecting means are performed as glue points in certain areas between the optical outcoupling body and the substrate electrode, whereas said glue points are performed as electrical conductive glue points.

The present invention is also directed to a method for shunting a substrate electrode of an electroluminescent device by an electrical shunt means, the electroluminescent device comprising a substrate and on top of the substrate the substrate electrode, a counter electrode and an electroluminescent layer stack with at least one organic electroluminescent layer arranged between the substrate electrode and the counter electrode, the method comprising the steps of fixing at least one element of the group of a wire, a metallic stripe or foil to the substrate electrode forming the electrical shunt means, applying a protective means fully covering the electrical shunt means with a shape suitable to prevent the emergence of a shadowing edge on the substrate electrode and applying the electroluminescent layer stack and the counter electrode on top of the substrate electrode with attached shunting means covered by protective means.

At the beginning of the shunting method, a wire, a metallic stripe or a foil forming a single conductive element or a plurality of single conductive elements are fixed to the surface of the substrate electrode. Said fixing can be performed with a fixing device like a spring-based holder or any similar arrangement suitable to fix the conductive element to the surface of the substrate electrode. After fixing, the conductive element forming the electrical shunt means, said protective means is applied fully covering the electrical shunt means with a shape, suitable to prevent the emergence of shadowing edges on the substrate electrode.

In an embodiment the method further comprises the step of applying an electrical connecting means to the substrate electrode for electrically contacting the electrical shunt means to the substrate electrode preferably by using electrical conductive glue forming the electrical connecting means.

According to yet another embodiment, said electrical connecting means may lead to a first fixing of the shunt means, and after applying the shunt means to the surface of the substrate electrode by using said electrical connecting means, the protective means is applied fully covering said electrical shunt means and fully covering the electrical connecting means.

The afore-mentioned electroluminescent device and/or method, as well as claimed components and the components to be used in accordance with the invention in the described embodiments are not subject to any special exceptions with respect to size, shape or the material selection. Technical concepts such that the selection criteria are known in the pertinent field can be applied without limitations. Additional details, characteristics and advantages of the object of the present invention are disclosed in the sub claims and the following description of the respective figures, which are an exemplarily fashion only, showing a plurality of preferred embodiments of the electroluminescent device according to the present invention.

BRIEF DESCRIPTION OF THE DRAWINGS

Further embodiments of the invention will be described with respect to the following Figures, which show.

DETAILED DESCRIPTION OF EMBODIMENTS

Figure 1:
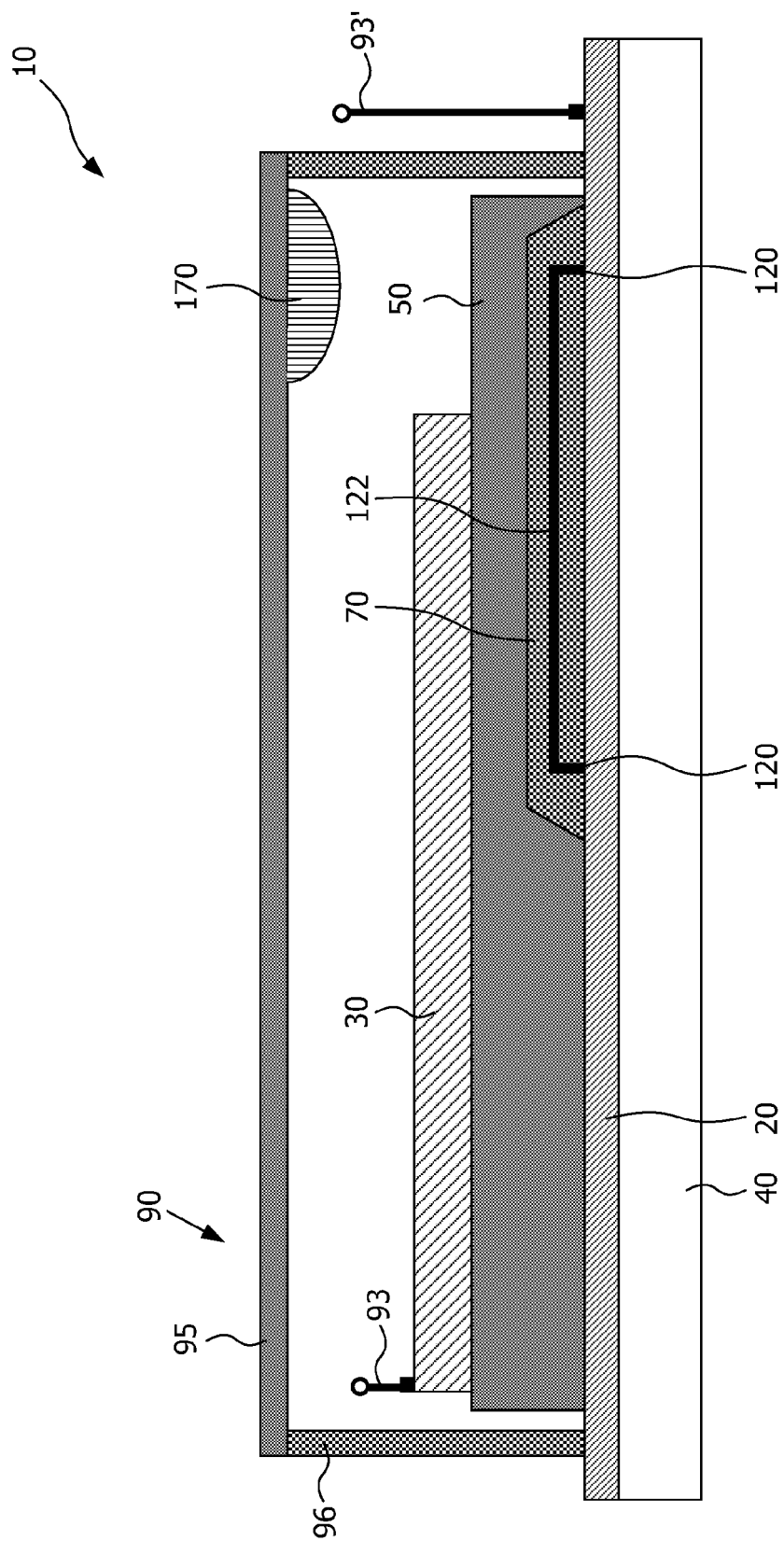
FIG. 1 a first embodiment of an electroluminescent device according to the invention, FIG. 2 the electroluminescent device with a contact means to an encapsulation means, FIG. 3 a top view of the electroluminescent device according to FIG. 2, FIG. 4 another embodiment of the electroluminescent device according to the present invention, FIG. 5 a modified embodiment of the electroluminescent device comprising another embodiment of the arrangement of the electrical shunt means, FIG. 6 a top view of the electroluminescent device according to FIG. 5, FIG. 7 a top view of the electroluminescent device according to another embodiment, FIG. 8 the electroluminescent device with applied scattering means within the protective means, FIG. 9 a cross-section of the electroluminescent device illustrating an electrical shunt means according to a first geometrical embodiment, FIG. 10 a cross-section of the electroluminescent device comprising an electrical shunt means according to a second geometrical embodiment.

In FIG. 1 an electroluminescent device 10 according to a first embodiment of the invention is shown. The electroluminescent device 10 comprises a substrate electrode 20, a counter electrode 30 and an organic electroluminescent layer 50 representing the electroluminescent layer stack in this and the following examples. The organic electroluminescent layer 50 is arranged between the substrate electrode 20 and the counter electrode 30 forming said layer stack. These layers are arranged on a substrate 40, forming the carrier material of the electroluminescent device 10. In the shown embodiment the substrate electrode 20 is formed by an approximately 100 nm thick layer of ITO, which is transparent and conductive. With a typical resistance of 10 to 20 Ohms per square of the ITO electrode, OLED designs with a high luminous efficacy show a luminance drop of 50% after 1.5 to 2 cm away from the edge of the substrate electrode, which starts to be visible. Onto this substrate electrode 20 the organic electroluminescent layer 50 is deposited. If a voltage is applied between the substrate electrode 20 and the counter electrode 30 some of the organic molecules within the organic electroluminescent layer 50 are exited, resulting in the emission of artificial light, which is emitted by the electroluminescent layer 50. The counter electrode 30 is formed by a layer of aluminum, working as a mirror reflecting the artificial light through the substrate electrode 20 and the substrate 40. To emit light into the surrounding the substrate 40 in this embodiment is made of glass. Thus, the electroluminescent device 10 is a bottom emitting OLED. The electroluminescent device 10 shown in the following figures as well as the components and the components used in accordance with the invention are not shown true to their scale. Especially the thickness of the electrodes 20 and 30, the organic electroluminescent layer 50 and the substrate 40 are not true in scale. All figures just serve to clarify the invention.

As shown in FIG. 1 the organic electroluminescent layer 50 and the counter electrode 30 are encapsulated by an encapsulation means 90. The encapsulation means 90 comprises a lid-like shape comprising a top of encapsulation means 95 and a side of encapsulation means 96, completely enclosing the composition of said layers. In order to provide an current supply to the counter electrode 30 and the substrate electrode 20, connection means 93 and 93' are provided. The connection means 93 for contacting the counter electrode 30 is only shown in an exemplary fashion, and a detailed electrical connection of the counter electrode 30 within the encapsulation means 90 is shown below.

The encapsulation means 90 has to be gas-tight to prevent ambient atmosphere from damaging the organic electroluminescent layer 50 or any of the two electrodes 20 and 30, encapsulated in the encapsulation means 90. The shown electroluminescent device 10 furthermore may comprise a getter 170 arranged within the encapsulation means 90. This getter is used to absorb humidity or other damaging gases, which happens to diffuse into a protected area within the encapsulation means 90. The getter 170 may comprise CaO or Zeolites. Other materials are known to a person skilled in the art.

On the surface of the substrate electrode is shown an electrical shunt means 122, depicted in an abstract form. Electrical shunt means 122 lead to an alignment of the voltage across the substrate electrode 20. Thus, the electrical shunt means 122 forms an electrical interconnection between at least two electrical connecting means 120, arranged in different distances to the outer area of the substrate electrode 20, and thus, a first electrical connecting means 120 is arranged in or near the center of the emitting field across the substrate electrode 20 and a second electrical connecting means 120 is arranged in the border area of the emitting field. In general, different electrical shunt means 122 according to the prior art are already known. The known shunt means 122 are applied on the substrate electrode 20 by screen printing or by the use of photolithography. Moreover, hot-melt ink jet printing is known for the application of electrical shunt means 122, and the electrical shunt means 122 are arranged directly on the substrate electrode 20 along the entire length of the shunt means 122. According to the present invention the electrical shunt means 122 is at least one element of the group of the wire, a metallic stripe or a foil. Said wire, metallic stripe or foil forms a single conductive element, which has to be applied to the surface of the substrate electrode 20 via an electrical connection, performed by said connecting means 120. Even a very thin copper wire of 0.1 mm diameter typically has a resistance of only 2.2 Ohms per meter length, or 0.22 Ohms per 10 cm of length, so it can easily be used for shunting on a prototypical 15 cm large OLED substrate covered with a 10 to 20 Ohms per square ITO. The resulting improvement of the voltage drop from edge to middle of the substrate electrode depends on the number of shunt lines used, but a 90% improvement can easily be achieved. The advantage of this shunting scheme is the usage of shunting means that are much thicker than the normally used thin metallic films on top of the substrate electrode.

The mechanical fixing of the electrical shunt means 122 to the substrate electrode 20 is performed by a protective means 70 fully covering the electrical shunt means 122 with a shape suitable to prevent the emergence of a shadowing edge on the substrate electrode 20. As shown in the depiction, said protective means 70 entirely encloses the electrical shunt means 122. The electrical shunt means 122 feature a long drawn elongated shape, and the protective means 70 is adapted to the elongated shape and is performed as a kind of a protective track along the electrical shunt means 122. Moreover, the electrical connecting means 120 is likewise covered by the protective means 70. In its result, a smooth, soft transition is formed between the electrical shunt means 122 and the remaining surface of the substrate electrode 20. This leads to the advantage, that the following layers, comprising at least the organic electroluminescent layer 50 and the counter electrode 30 can be deposited both onto the protective means 70 and the surface of the substrate electrode 20 without the emergence of shadowing edges.

Figure 2:
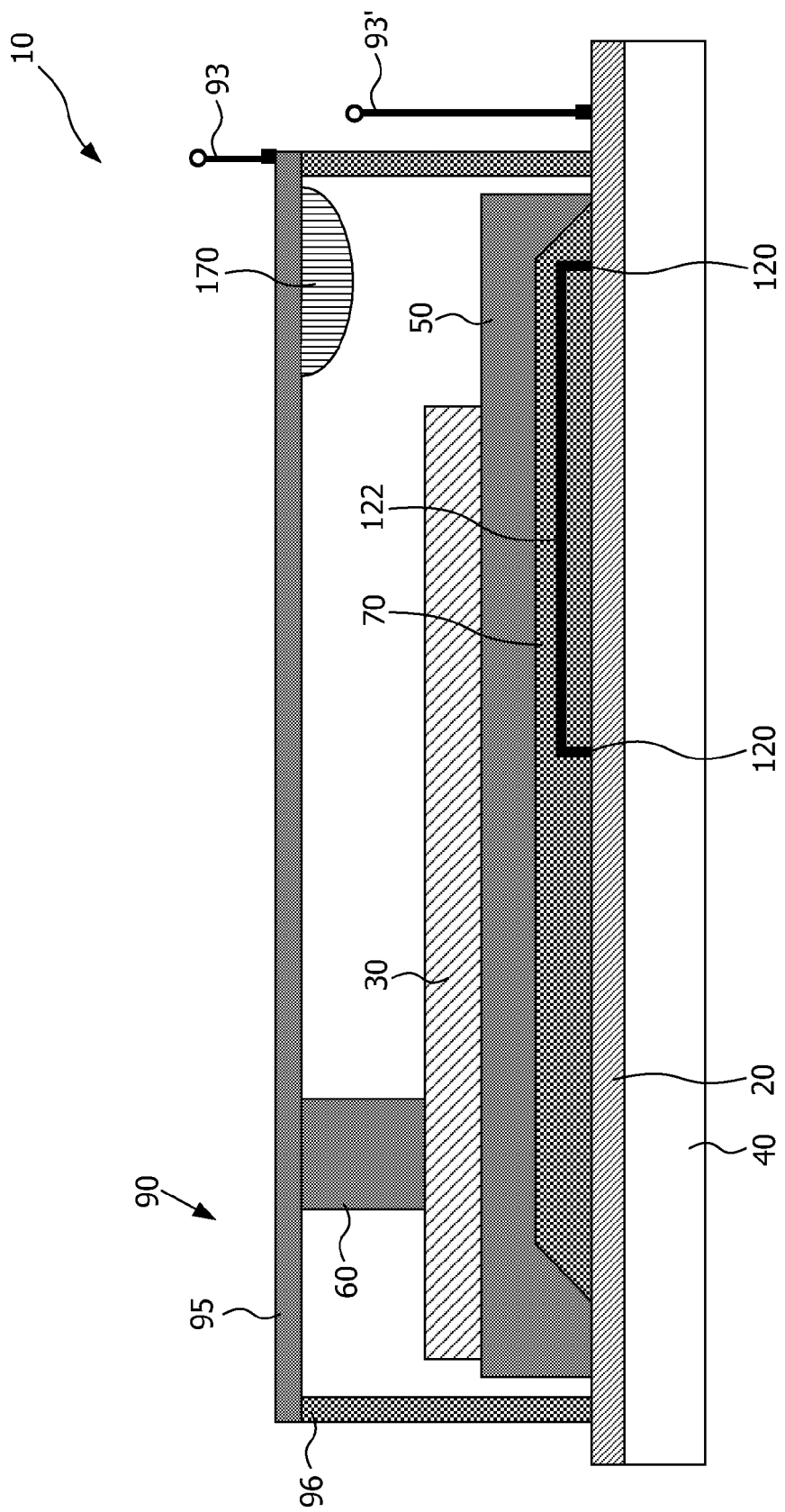

FIG. 2 shows the arrangement of FIG. 1 comprising an applied contact means 60. The electroluminescent device 10 may comprise at least one or a plurality of the depicted contact means 60, arranged for electrically contacting the counter electrode 30 to an electrical power source. The contact means 60 is therefore part of the path leading from the counter electrode 30 to the electrical source. The contact means 60 is arranged fully above the non-conductive protective means 70 in order to prevent any mechanical damage of the layers underneath eventually leading to short between counter electrode 30 and substrate electrode 20. The material of the contact means 60 may by conductive glue, which can be applied in a gentle manner to the counter electrode 30, so that there is no damage to the counter electrode 30 and the organic electroluminescent layer 50 and/or the electroluminescent layer stack in general leading to a short between the two named electrodes 20 and 30.

The contact means 60 can be performed in an electrical conductive glue, arranged in direct electrical contact with the counter electrode 30 as well as with the encapsulation means 90. Therefore, it is easy to electrically connect the counter electrode 30 to an electrical power source via said encapsulation means 90. The user just has to apply an electrical conductive means to the encapsulation means 90, shown as a connecting means 93. The conductive glue between the encapsulation means 90 and the counter electrode 30 then leads the electrical current to the counter electrode 30. In the shown embodiment, the encapsulation means 90 is on the one hand connected to the substrate electrode 20 and on the other hand in contact with the conductive glue of the contact means 60. To prevent a short at least a part of the encapsulation means 90 and/or the encapsulation means 90 as a whole must be insulated against the substrate electrode 20. In the shown embodiment a top of encapsulation means 95 is electrical conductive, whereas a side of encapsulation means 96 is electrical insulating. Therefore, a short between the counter electrode 30 and the substrate electrode 20 via said encapsulation means 90 is prevented.

When conductive glue is used to form the electrical contact means 60, a preferred embodiment of the disclosed electroluminescent device 10 comprises said protective means 70, which is performed as an electrical non-conductive protective means 70. The electrical non-conductive protective means 70 is arranged at least fully covering the area below the contact means 60. The protective means 70 is arranged on the substrate electrode 20, and the protective means 70 can protect the area below the contact means 60 and can also enclose the electrical shunt means 122. This arrangement using the protective means 70 satisfying two objectives, namely fully covering the shunt means 122 and fully covering the area below the electrical contact means 60, and which requires an electrical non-conductive glue forming the protective means 70. This leads to the result, that the occurrence of shorts between the counter electrode 30 with the applied contact means 60 and the substrate electrode 20 is prevented.

Figure 3:
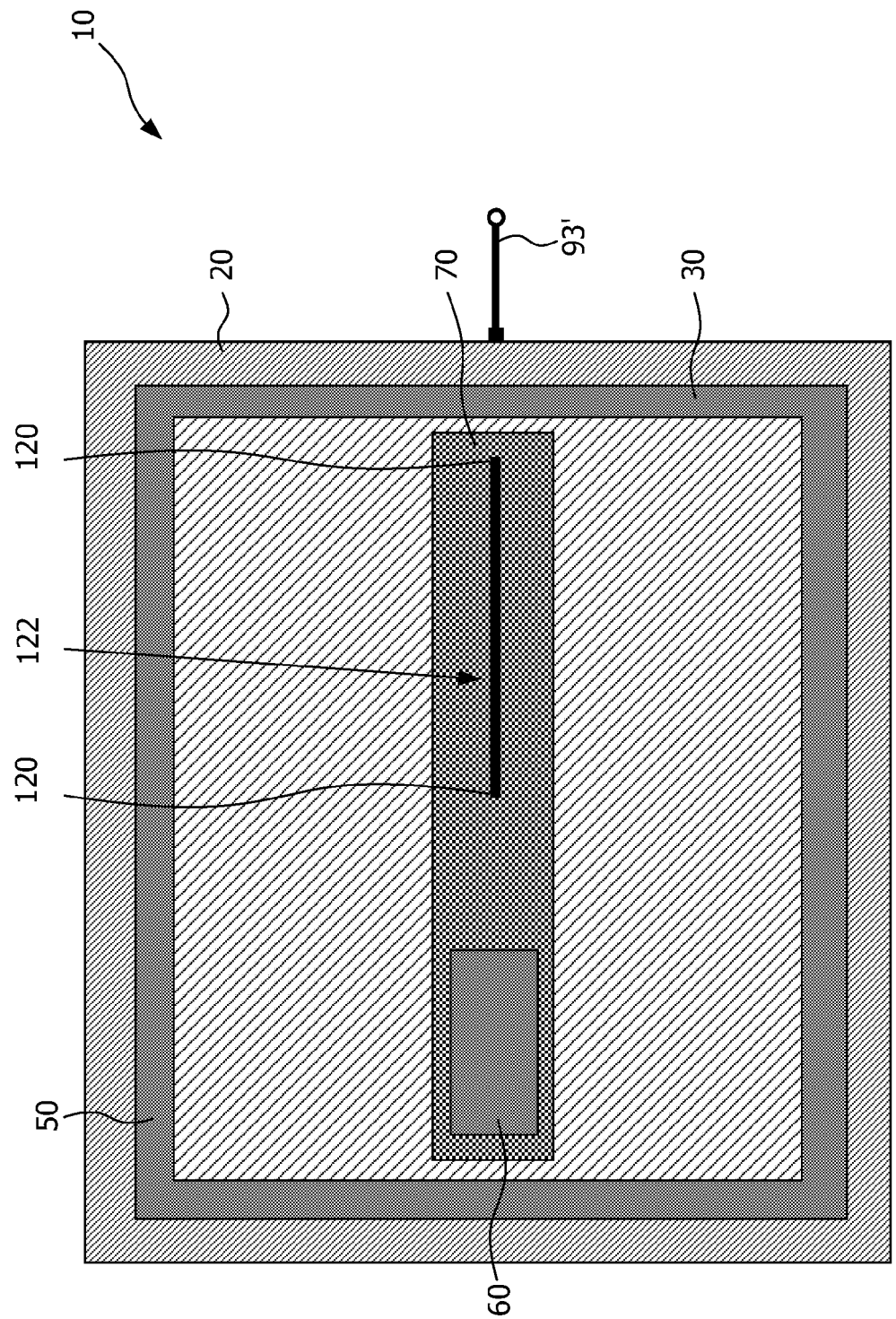

FIG. 3 shows a view on the backside of the electroluminescent device 10 according to FIG. 2. For easier understanding, the electroluminescent device 10 is shown without the encapsulation means 90. The protective means 70 is arranged on the substrate electrode 20 and features electrical non-conductive glue. It is the aim of the protective means 70 to encapsulate the shunt means 122, arranged between the electrical connecting means 120, which are also covered by the protective means 70. According to the depiction the arrangement of the shunt means 122 and said electrical connecting means 120 respectively, is arranged beside the arrangement of the electrical contact means 60. Thus, said protective means 70 covers a large part of the area of the electroluminescent device 10, when the electrical contact means 60 is arranged at a first location and the shunt means 122 is arranged at a second location within said emitting field.

Figure 4:
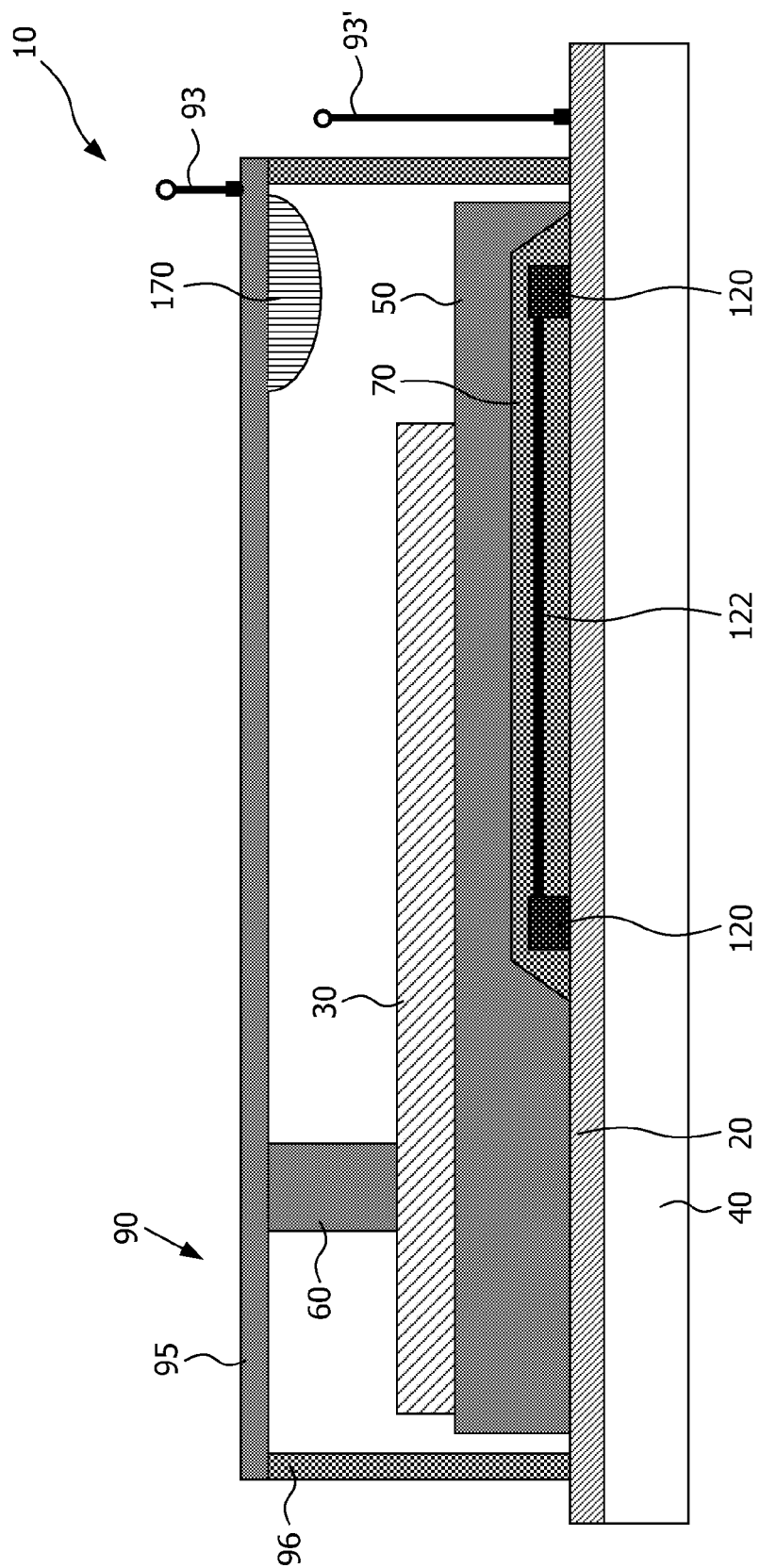

In FIG. 4 is shown another embodiment of the electroluminescent device 10, comprising a shunt means 122 for shunting the substrate electrode 20 and an electrical contact means 60 for contacting the counter electrode 30 to the top of encapsulation means 95. According to the depicted embodiment said electrical contact means 60 is overlapping the arrangement of the electrical shunt means 122. Thus, the protective means 70 encapsulating the electrical shunt means 122 is fully covering the area underneath the electrical contact means 60. This arrangement requires a non-conductive behavior of the protective means 70, which can be performed as non-conductive glue. The electrical shunt means 122 is contacted to the substrate electrode 20 by means of an electrical connecting means 120. As well as the electrical shunt means 122, the electrical connecting means 120 are encapsulated within the non-conductive protective means 70. Basing on this arrangement, the non-emissive area within the emitting field of the electroluminescent device 10 is minimized, because the arrangement of the protective means 70 both covers the electrical shunt means 122 and overlaps the area below the electrical contact means 60.

Figure 5:
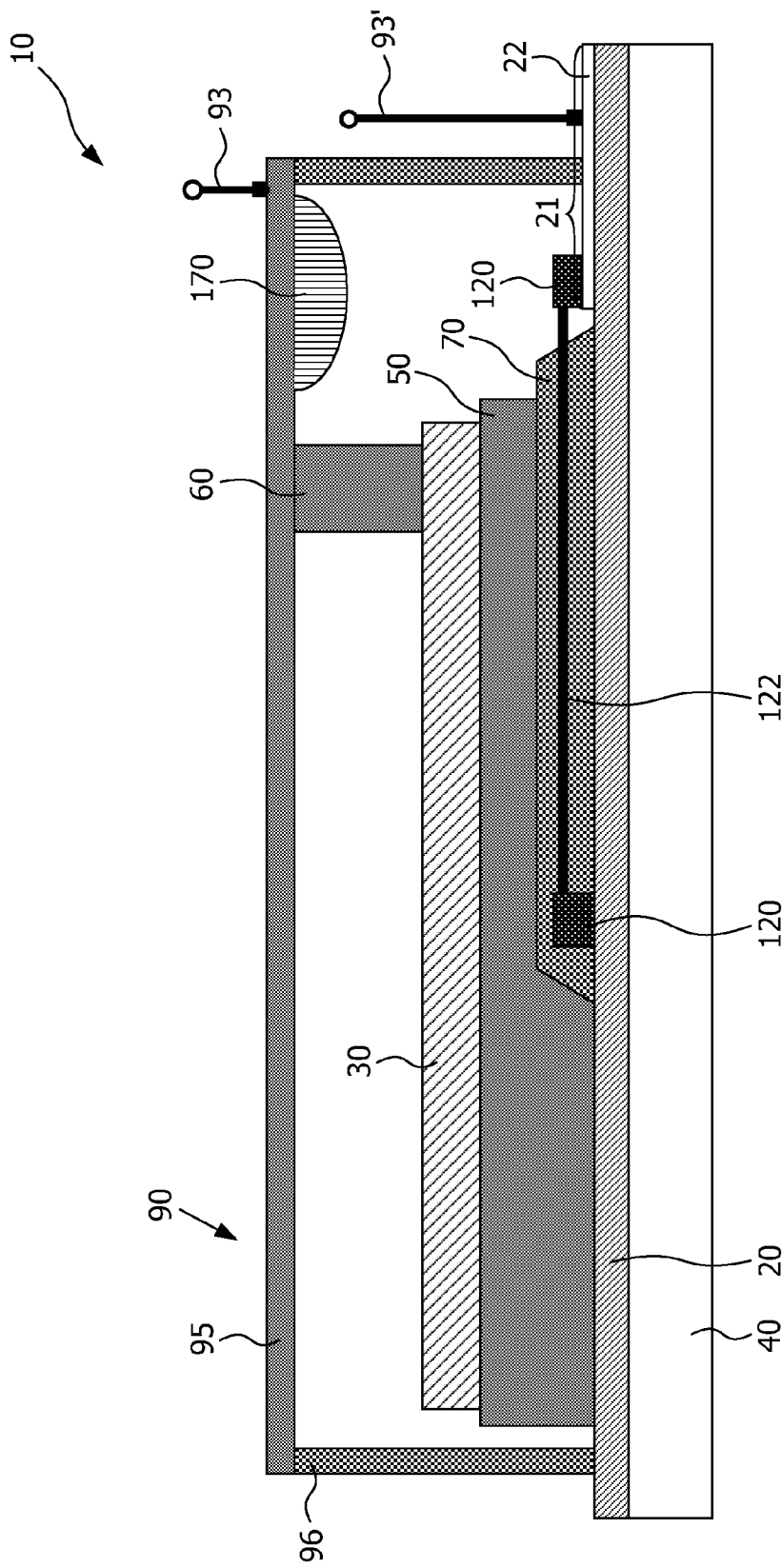

FIG. 5 shows yet another embodiment of the electroluminescent device 10. In this embodiment the substrate electrode 20 features a contacting area 21 in the border area of the electroluminescent device 10. The connection means 93' for power supplying the substrate electrode 20 is electrically connected to the contacting area 21, consisting of an additional applied conductive material 22. This additional applied conductive material 22 features a high electrical conductivity, which is higher than the electrical conductivity of the substrate electrode 20. The lateral extension of the contacting area 21 passes over the arrangement of the encapsulation means 90 and in particular crosses over the side of the encapsulation means 96. Thus, said connecting means 93' can be arranged outside the encapsulation means 90, whereas the electrical connecting means 120 within the encapsulation means 90 for connecting the electrical shunt means 122 may feature a direct electrical contact to the connecting means 93' by applying an electrical connecting means 120 on top of the surface of the contacting area 21. According to this embodiment, the protective means 70 formed by electrical non-conductive glue encapsulates the electrical shunt means 122 in the area below the organic electroluminescent layer 50 as well as below the counter electrode 30. By the use of said protective means 70 the electrical shunt means 122 leads through said layer system and ends in the electrical connecting means 120.

Figure 6:
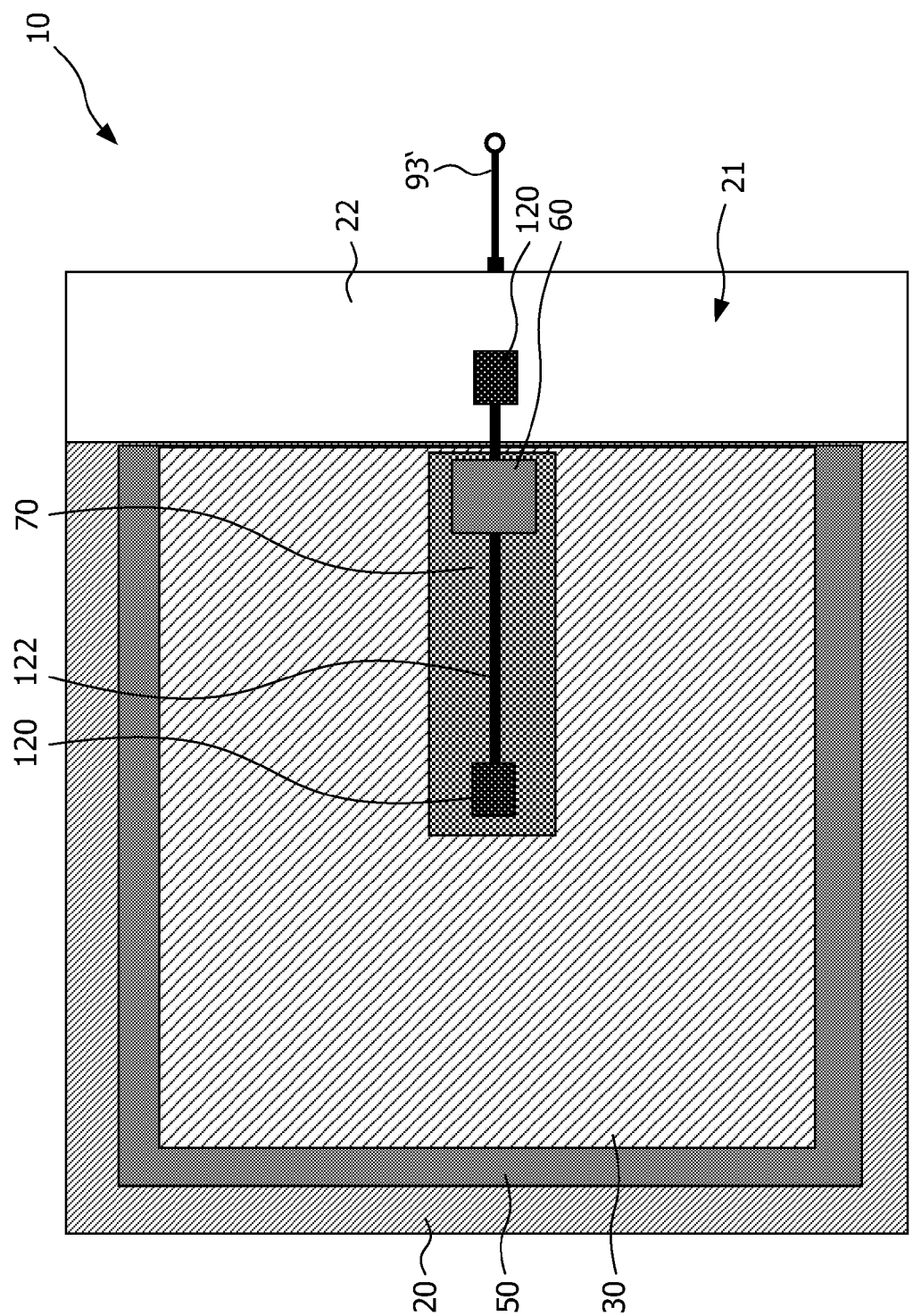

FIG. 6 is a backside view of the electroluminescent device 10 according to FIG. 5. As shown, the additional applied conductive material 22 is arranged at the boarder side of the electroluminescent device 10, whereas the arrangement of said additional applied conductive material 22 according to the exemplary depiction is limited to only one side of the electroluminescent device 10. As shown, the electrical connecting means 120 for electrically contacting the electrical shunt means 122 to the conductive material 22 is arranged within the contacting area 21. The electroluminescent layer 50 and the counter electrode 30 are limited to an area beside the contacting area 21, and the electrical shunt means 122 passes over from the area of the organic electroluminescent layer 50 to the contacting area 21.

Figure 7:
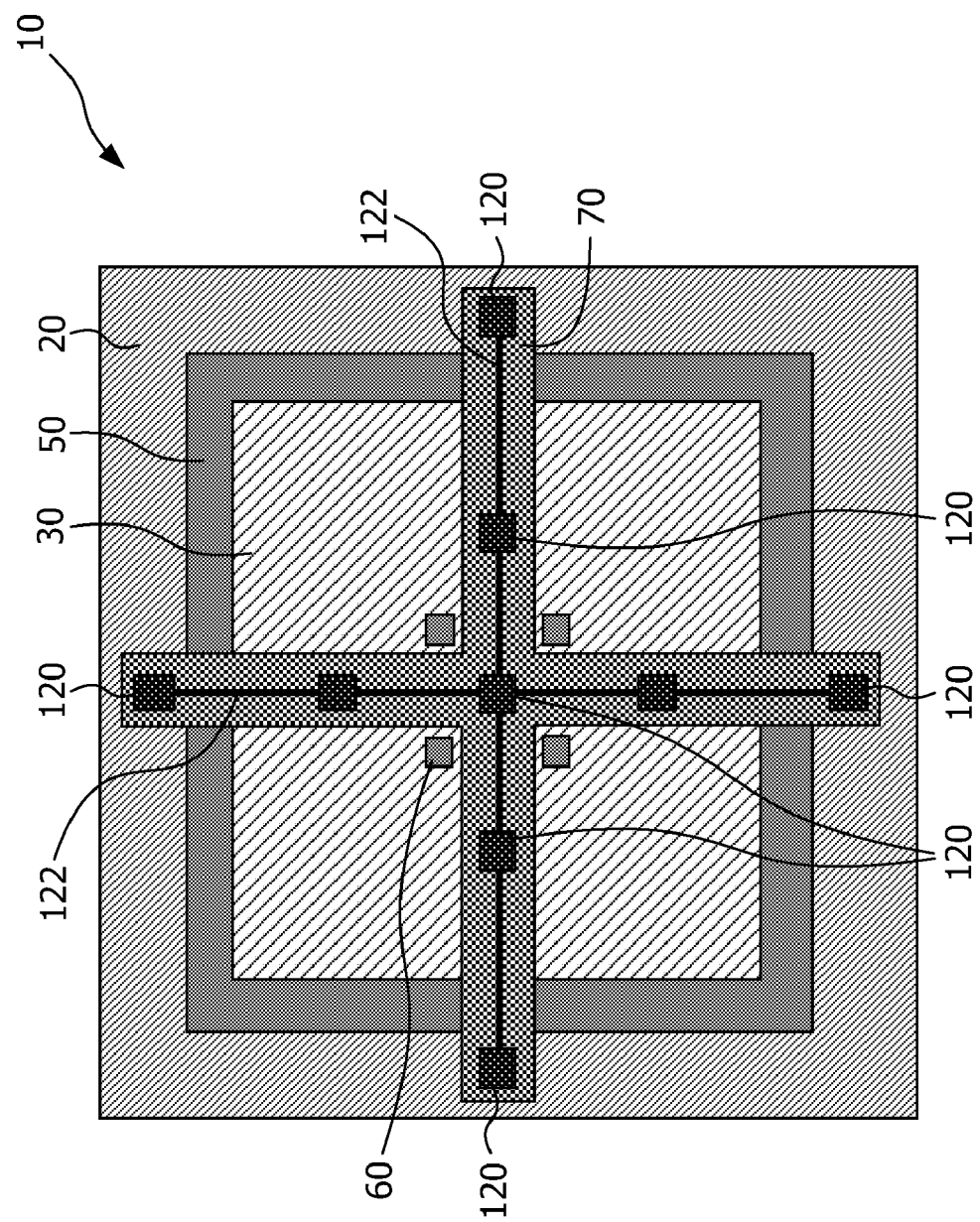

FIG. 7 shows another embodiment of shunting the substrate electrode 20 of an electroluminescent device 10. As shown, two electrical shunt means 122 are arranged, namely a first electrical shunt means 122 in a vertical extension and a second electrical shunt means 122 featuring a horizontal extension. The electrical shunt means 122 are electrically connected to the substrate electrode 20 by the use of electrical connecting means 120, which are performed as several conducting posts, made of electrical conductive glue. The electrical connecting means 120 can be divided into electrical connecting means outside the organic electroluminescent layer 50 and the counter electrode 30 and electrical connecting means 120 within the light emitting area of the organic electroluminescent layer 50 and the counter electrode 30, respectively. Each electrical connecting means 120 features the same electrical potential, leading to an aligned intensity of light across the entire emitting field. The protective means 70 is arranged for fully covering the electrical shunt means 122 and the electrical connecting means 120, whereas, according to another embodiment said protective means 70 can also cover the area below the electrical contact means 60 (not shown in detail).

Figure 8:
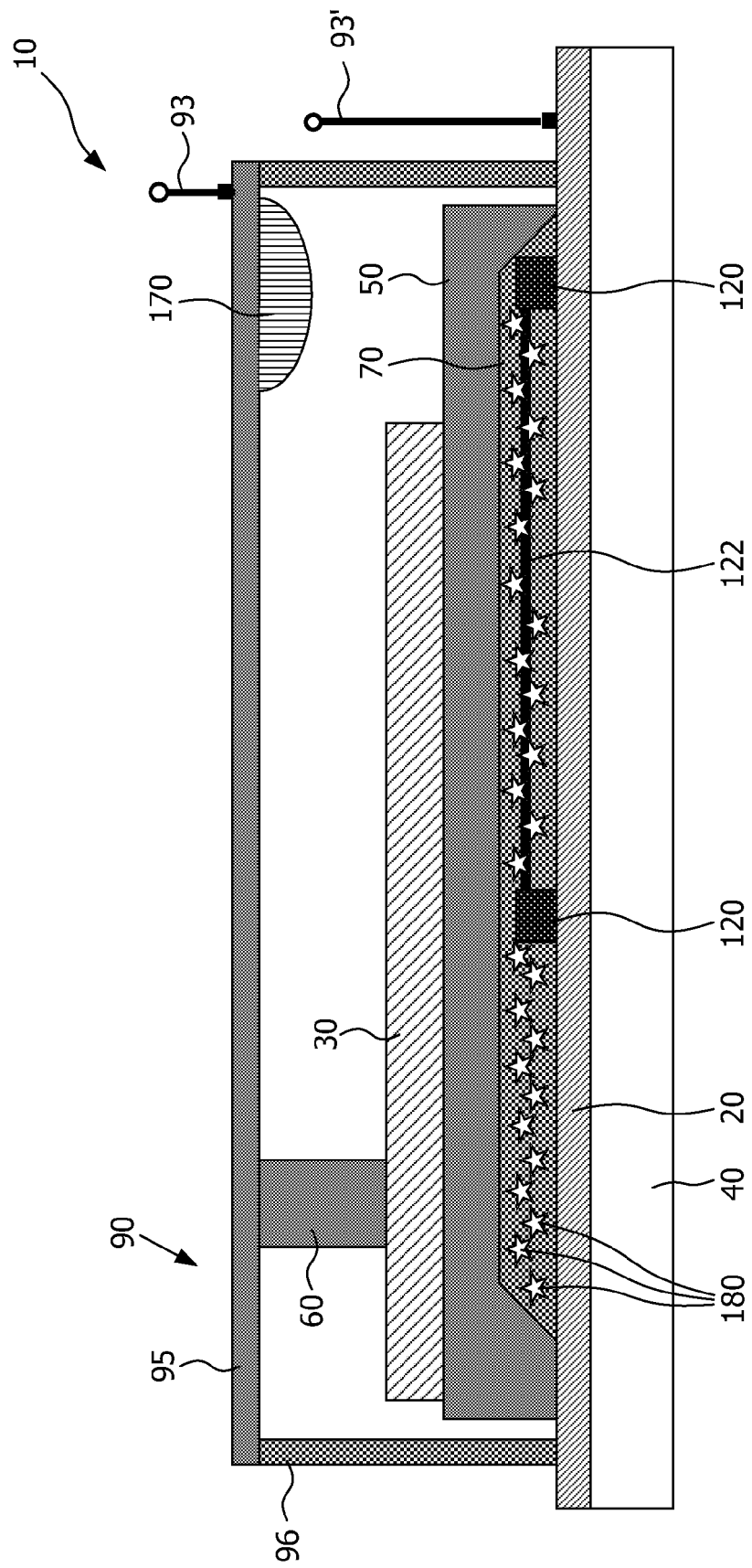

FIG. 8 shows an embodiment of the electroluminescent device 10 with a protective means 70, fully covering the electrical connecting means 120 and the electrical shunt means 122 between said connecting means 120. As disclosed, the protective means 70 comprise at least one scattering means 180 for scattering light generated by the organic electroluminescent layer 50, preferably that the scattering means 180 is embedded within the protective means 70. This scattering means 180 scatters and/or reflects part of the artificial light guided by the substrate 40. This results in a brightening of the otherwise non-emissive area. As the substrate 40 often works as a kind of light guide, the scattering means 180 of the protective means 70 enables this light to be scattered and reflected out of the electroluminescent device. The scattering means 180 may be formed by a plurality of pigments and/or flakes embedded in the protective means 70.

Figure 9:
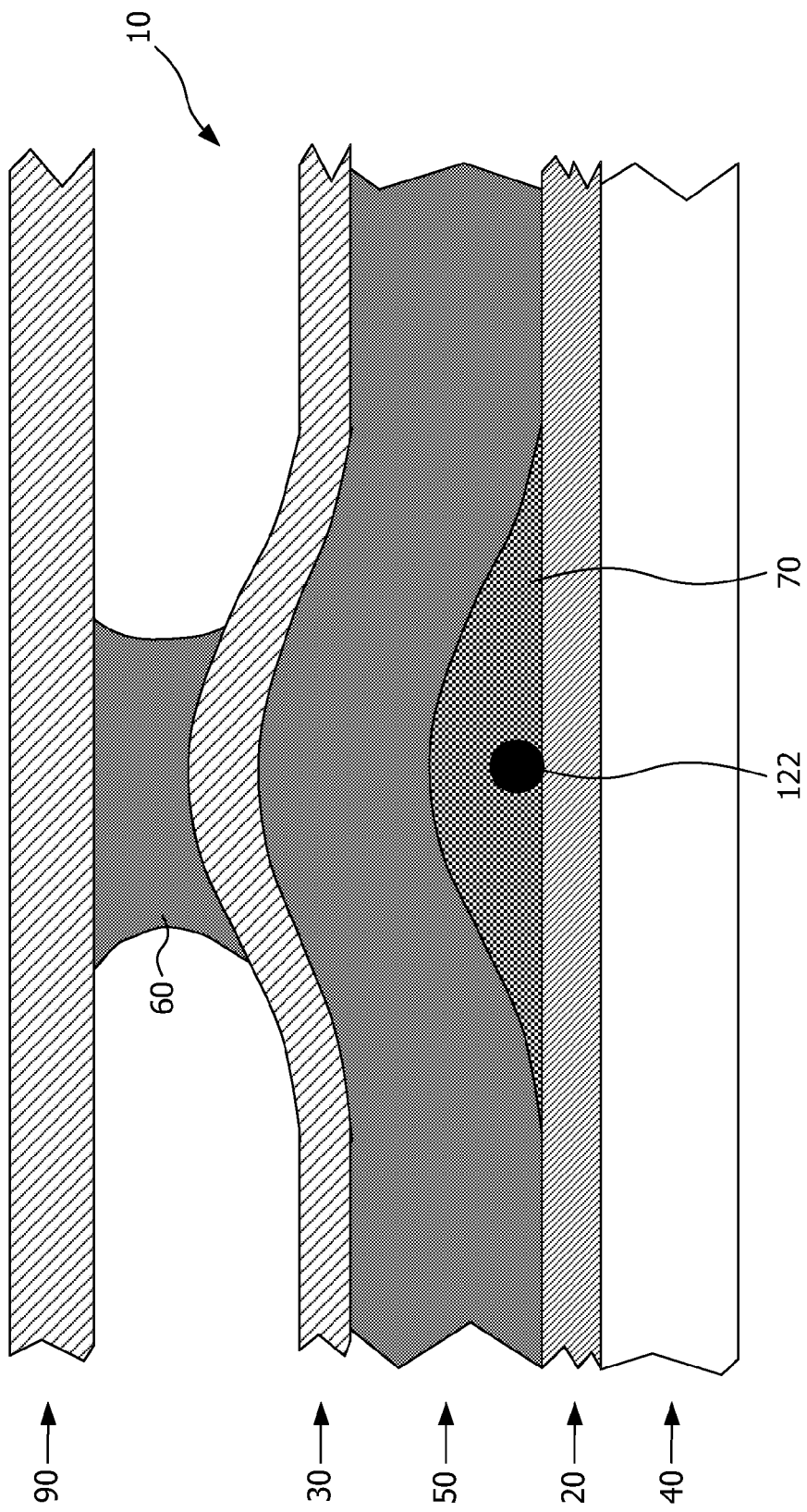

FIG. 9 shows a detailed depiction of the cross section through the electroluminescent device 10 in the area of the applied shunt means 122, embedded within the protective means 70. The system of the layers comprising the substrate electrode 20, the organic electroluminescent layer 50 and the counter electrode 30 are shown in a non-true scale and are just shown in an exemplary fashion to clarify the arrangement of the shunt means 122 within the protective means 70, made of electrical non-conductive glue. As shown in detail, the electroluminescent layer 50 and the counter electrode 30 are applied on the surface both of the substrate electrode 20 and of the protective means 70. The electrical shunt means 122 is shown in form of a wire, which may be a copper-wire or any conductive element with a circular shape, shunting the substrate electrode 20. Within the area of the protective means 70, covering the substrate electrode 20, an electrical contact means 60 is applied for contacting the counter electrode 30 to the encapsulation means 90, shown in form of the lid on the top of the layer system.

FIG. 10 shows another embodiment of the electrical shunt means 122 in form of a metallic stripe or foil. The metallic stripe forming the electrical shunt means 122 is fully encapsulated within the protective means 70 and forms a flat, but exemplary not plane shape. As a basic principal the conductive element forming the electrical shunt means 122 may feature any arbitrary cross section, and in particular the conducting element can be applied directly on the surface of the substrate electrode 20.

The described embodiments comprise as an example an organic electroluminescent layer 50 within the layer stack. In alternative embodiments within the scope of this invention, the electroluminescent layer stack may comprise layer additional to organic electroluminescent layer 50 such as whole transparent layers, whole blocking layers, electron transport layers, electron blocking layers, charge injection layers, further conducting layer etc.

LIST OF NUMERALS 10 electroluminescent device
20 substrate electrode
21 contacting area
22 additional applied conductive material
30 counter electrode
40 substrate
50 organic electroluminescent layer
60 electrical contact means
70 protective means
90 encapsulation means
93, 93' connection means
94 joint means
95 top of encapsulation means
96 side of encapsulation means
98 insulating means
120 electrical connecting means
122 electrical shunt means
170 getter
180 scattering means

The invention claimed is:

1. An electroluminescent device comprising a substrate and on top of the substrate a substrate electrode, a counter electrode and an electroluminescent layer stack with at least one organic electroluminescent layer arranged between the substrate electrode and the counter electrode, and at least one electrical shunt means applied on top of the substrate electrode to improve the current distribution over the substrate electrode, wherein the at least one electrical shunt means is at least one element of the group of a wire, a metallic stripe or foil, said electrical shunt means fixed to the substrate electrode by a protective means fully covering the electrical shunt means with a shape suitable to prevent the emergence of a shadowing edge on the substrate electrode, wherein the protective means are electrically conductive, and wherein the protective means conductive glue including a matrix comprising one or more organic materials and a filler comprising one or more inorganic materials.

2. The electroluminescent device according to claim 1, wherein at least one of the electrical shunt means is fixed to the substrate electrode by at least two electrical connecting means.

3. The electroluminescent device according to claim 2, wherein said electrical connecting means is selected from the group consisting of: electrical conductive glue, electrical conductive resin and/or electrical conductive lacquer.

4. The electroluminescent device according to claim 2, wherein the electrical connecting means applied to the electrical shunt means form a symmetrical array of electrical connecting means.

5. The electroluminescent device according to claim 2, wherein at least one electrical contact means comprises electrically conductive glue and is arranged for electrically contacting the counter electrode to an electrical power source, the electrical non conductive protective means at least partially covering the area below the contact means.

6. The electroluminescent device according to claim 5, wherein an encapsulation means is arranged for encapsulating at least said electroluminescent layer stack, and wherein the electrical contact means is arranged in between said encapsulation means and the counter electrode for electrically contacting the counter electrode to the encapsulation means.

7. The electroluminescent device according to claim 1, wherein the electrical shunt means comprises a metallic wire, a metallic stripe or a metallic foil made of a copper material, a gold material and/or a silver material.

8. The electroluminescent device according to claim 1, wherein the protective means comprise at least one scattering means for scattering light, generated by the organic electroluminescent layer, the scattering means being embedded, dissolved and/or contained within the protective means and/or the electrical connecting means.

9. The electroluminescent device according to claim 1, wherein the protective means features a specific spatial geometry, leading to an improved outcoupling of light, generated by the organic electroluminescent layer.

10. The electroluminescent device according to claim 9, wherein the protective means comprises an optical outcoupling body forming said specific spatial geometry, said optical outcoupling body being made of an optical transparent material featuring an index of refraction, which is substantially equal to or higher than the index of refraction of the substrate.

11. The electroluminescent device according to claim 10, wherein the electrical shunt means is arranged on the surface of the substrate electrode and wherein said optical outcoupling body covers the electrical shunt means in a way, that the arrangement of the electrical shunt means is performed sandwich like in between said substrate electrode and said optical outcoupling body.

12. An electroluminescent device comprising a substrate and on top of the substrate a substrate electrode, a counter electrode and an electroluminescent layer stack with at least one organic electroluminescent layer arranged between the substrate electrode and the counter electrode, and at least one electrical shunt means applied on top of the substrate electrode to improve the current distribution over the substrate electrode, wherein the at least one electrical shunt means is at least one element of the group of a wire, a metallic stripe or foil, said electrical shunt means fixed to the substrate electrode by a protective means fully covering the electrical shunt means with a shape suitable to prevent the emergence of a shadowing edge on the substrate electrode, wherein at least one of the electrical shunt means is fixed to the substrate electrode by at least two electrical connecting means, and wherein said electrical connecting means is selected from the group consisting of: electrical conductive glue, electrical conductive resin and/or electrical conductive lacquer.

13. An electroluminescent device comprising a substrate and on top of the substrate a substrate electrode, a counter electrode and an electroluminescent layer stack with at least one organic electroluminescent layer arranged between the substrate electrode and the counter electrode, and at least one electrical shunt means applied on top of the substrate electrode to improve the current distribution over the substrate electrode, wherein the at least one electrical shunt means is at least one element of the group of a wire, a metallic stripe or foil, said electrical shunt means fixed to the substrate electrode by a protective means fully covering the electrical shunt means with a shape suitable to prevent the emergence of a shadowing edge on the substrate electrode, wherein the protective means comprise at least one scattering means for scattering light, generated by the organic electroluminescent layer, the scattering means being embedded, dissolved and/or contained within the protective means and/or the electrical connecting means.

14. An electroluminescent device comprising a substrate and on top of the substrate a substrate electrode, a counter electrode and an electroluminescent layer stack with at least one organic electroluminescent layer arranged between the substrate electrode and the counter electrode, and at least one electrical shunt means applied on top of the substrate electrode to improve the current distribution over the substrate electrode, wherein the at least one electrical shunt means is at least one element of the group of a wire, a metallic stripe or foil, said electrical shunt means fixed to the substrate electrode by a protective means fully covering the electrical shunt means with a shape suitable to prevent the emergence of a shadowing edge on the substrate electrode, wherein the protective means features a specific spatial geometry, leading to an improved outcoupling of light, generated by the organic electroluminescent layer.

* * * * *